United States Patent
Heline, Jr. et al.

[11] Patent Number: 5,400,406
[45] Date of Patent: Mar. 21, 1995

[54] AIRCRAFT COMMUNICATION HEADSET TESTER

[75] Inventors: Ture A. Heline, Jr., Brookline; Robert Ingalls, Hooksett, both of N.H.

[73] Assignee: Gentex Corporation, Carbondale, Pa.

[21] Appl. No.: 274,580

[22] Filed: Jul. 13, 1994

Related U.S. Application Data

[63] Continuation of Ser. No. 88,667, Jul. 6, 1993.

[51] Int. Cl.6 ............................................. H04R 21/00
[52] U.S. Cl. ........................................ 381/58; 381/59
[58] Field of Search ................... 381/58, 59; 324/705, 324/713, 714, 73.1

[56] References Cited

U.S. PATENT DOCUMENTS

| | | |
|---|---|---|
| 2,408,878 | 10/1946 | Preston . |
| 4,048,564 | 9/1977 | Gleeson . |
| 4,061,891 | 12/1977 | Pommer ............................ 381/58 |
| 4,072,900 | 2/1978 | Ray . |
| 4,577,072 | 3/1986 | Lulay . |
| 4,591,671 | 5/1986 | Pinede et al. . |
| 4,714,875 | 12/1987 | Bailey ............................... 324/73.1 |
| 4,903,323 | 2/1990 | Hendershot . |
| 5,163,079 | 11/1992 | Crowdis . |

FOREIGN PATENT DOCUMENTS 2401228  1/1974  Germany ............................ 381/58

OTHER PUBLICATIONS

D. Edwards, "Experimental Bridge-Type Ohmmeter" *Electronics Australia*, vol. 36, No. 3, p. 52–55, Jun. 1974.
R. Harris, "Linear Ohmmeter", *Practical Electronics*, vol. 14, No. 1, Sep. 1977.

Primary Examiner—Curtis Kuntz
Assistant Examiner—Mark D. Kelly
Attorney, Agent, or Firm—Shenier & O'Connor

[57] ABSTRACT

A self-contained, hand-held device for testing an aircraft helmet communication system including a microphone and earphones in which a selection switch on the housing of the device is movable from an off position to a talk-through position at which the microphone is connected to both the earphones and a volume indicator on the housing and to a self-test position in which actuation of a pushbutton switch on the housing applies the output of an oscillator both to the volume indicator and a circuit having a voltage divider made up of a potentiometer and a fixed resistance to provide a self-test signal which energizes an illuminable element on the housing if the device is functioning properly and to an earphone impedance test position at which the output of the oscillator is applied to a circuit having a voltage divider made up of the potentiometer and the earphones to produce an earphone impedance-test signal which energizes the illuminable element if the earphone impedance is of the correct value. The potentiometer is adjustable from outside the housing.

10 Claims, 2 Drawing Sheets

AIRCRAFT COMMUNICATION HEADSET TESTER

This is a continuation of copending application Ser. No. 08/088,667, filed on Jul. 6, 1993.

FIELD OF THE INVENTION

The invention is in the field of testing apparatus and more particularly relates to a device for testing aircraft communication headsets.

BACKGROUND OF THE INVENTION

There are known in the prior art aircraft communication headsets incorporating earphones and a microphone. Many of these sets are installed in protective helmets, such as are worn by pilots. The earphones customarily are located within earcups supported on the helmet. The earcup leads have a plug for connection to the aircraft communication system. Similarly, the microphone customarily is supported on a boom on the helmet and is likewise provided with a plug for connection to the communication system.

It is desirable that some means be provided for easily and expeditiously testing the communication elements carried by the helmet.

SUMMARY OF THE INVENTION

One object of our invention is to provide an aircraft communication headset tester.

Another object of our invention is to provide an aircraft communication headset tester which permits the headset components to be tested in a rapid and expeditious manner.

A further object of our invention is to provide an aircraft communication headset tester which permits the wearer of a helmet to test headset components carried by the helmet without doffing the helmet.

Still another object of our invention is to provide an aircraft communication headset tester having a self-test feature.

A still further object of our invention is to provide an aircraft communication headset tester affording a talk-through test.

Yet another object of our invention is to provide an aircraft communication headset tester which checks the impedance of the earphones of the headset.

Other and further objects of our invention will appear from the following description.

BRIEF DESCRIPTION OF THE DRAWINGS

In the accompanying drawings which form part of the instant specification and which are to be read in conjunction therewith and in which like reference numerals are used to indicate like parts in the various views.

DESCRIPTION OF THE PREFERRED EMBODIMENT

Figure 1:
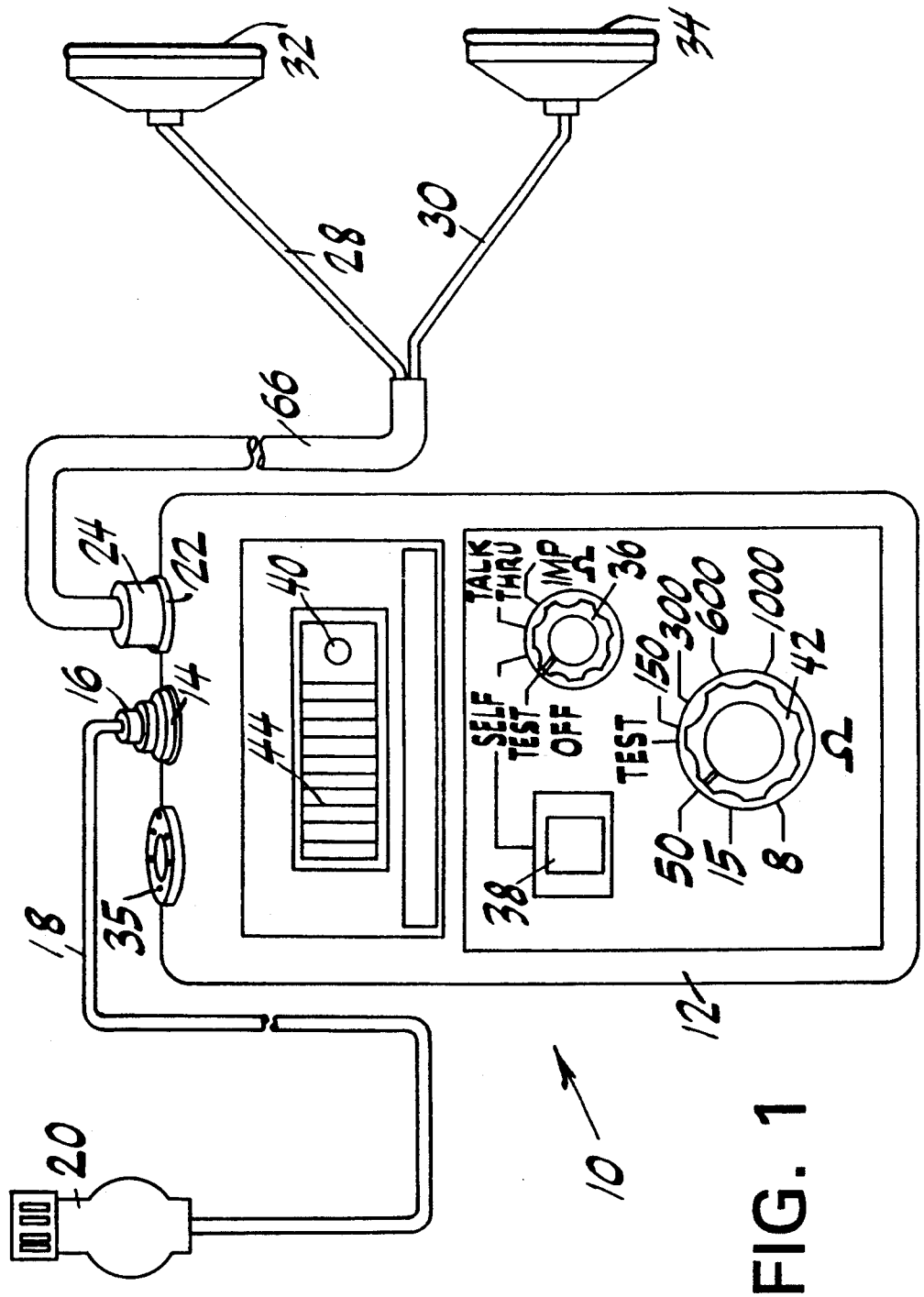
FIG. 1 is a front elevation of our aircraft communication headset tester in conjunction with a microphone and a pair of earphones.

Referring now to FIG. 1 of the drawings, our tester indicated generally by the reference character 10, has a casing or housing 12 which is of a size which permits it to be held in the user's hand.

The casing 12 carries a first receptacle 14 adapted to receive a plug 16 carried by the lead 18 of a microphone 20. Microphone 20 may be of any suitable type known to the art which is adapted to be mounted on a helmet by means of a boom.

Casing 12 carries a second receptacle 22 adapted to receive a plug 24 carried by the main earphone lead 26. Lead 26 includes a pair of branch leads 28 and 30 connected to the earphones 32 and 34. As is pointed out hereinabove, the earphones 32 and 34 may be supported in the pilot's helmet by any suitable means known to the art. Preferably we provide a third receptacle 35 for receiving the plug of a combined earphone-microphone lead (not shown).

A function selector switch arm 36 mounted on the casing 12 is adapted to be moved from an "OFF" position to a self-test position indicated by "SELF" a "TALK THRU" position and an impedance testing position indicated as "IMP". As will be explained more fully hereinbelow, in the "SELF" position of arm 36 a self-test may be performed by pushing a button 38. If the tester 10 is functioning satisfactorily, a lamp 40 will light upon actuation of the button 38. In the "TALK THRU" position of arm 36, a person speaking into the microphone 20 can hear himself through the earphones 32 and 34. In the impedance test position "IMP" of arm 36, the lamp 40 will light if the impedance of the earphones matches an internal impedance of the tester 10. This internal impedance can be set by a potentiometer arm 42 on the casing 12.

Casing 12 also supports an LED bar graph display 44 which, as will be explained hereinbelow, goes up and down in relation to the strength of the voice of the person speaking into the microphone 20.

Figure 2:
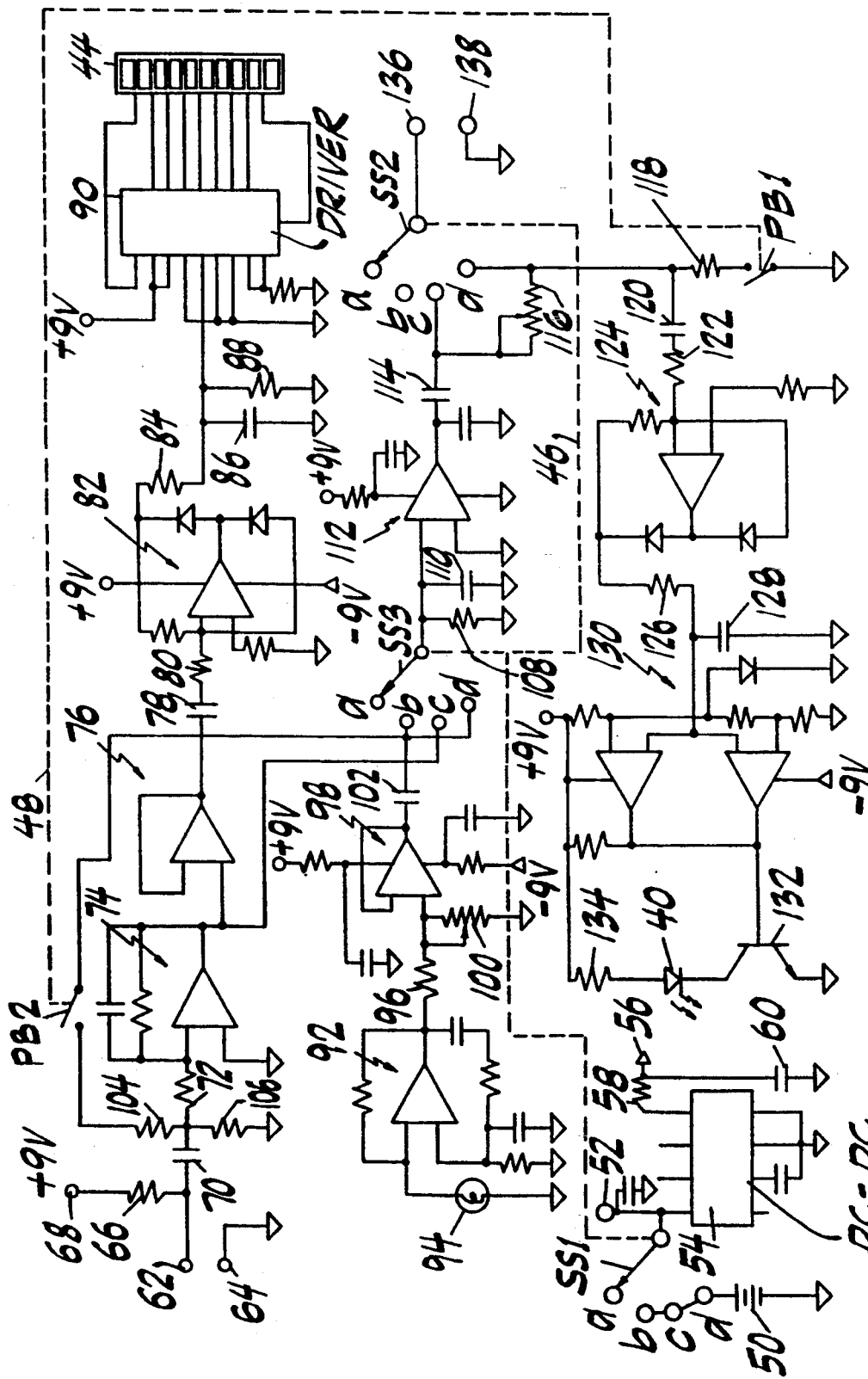
FIG. 2 is a schematic view of the circuitry incorporated in the tester shown in FIG. 1.

Referring now to FIG. 2, the function selector switch operated by arm 36 includes switch arms SS1, SS2 and SS3 which are ganged as indicated by the broken line 46 so that in any position of the arm 36, arms SS1, SS2 and SS3 all engage the corresponding associated contact "a" "b" "c" or "d".

Actuation of button 38 closes switches PB1 and PB2 as indicated by the broken line 48.

Contacts "a" associated with switch arms SS1, SS2 and SS3 correspond to the "OFF" position of the operating arm 36. Contacts "b" correspond to the "SELF" test position of arm 36. Contacts "c" correspond to the "TALK THRU" position of arm 36, while contacts "d" correspond to the impedance test position "IMP" of arm 36.

Contacts "b" "c" and "d" associated with arm SS1 are connected to each other and to the positive terminal of a battery 50 having a potential of, for example, 9 volts. When arm SS1 engages any of the contacts "b", "c" or "d", the battery 50 is connected to a terminal 52 to provide a 9 volt positive potential at that terminal. Further, with SS1 in engagement with any of the contacts "b", "c" or "d", the 9 volt potential of battery 50 is applied to a DC-DC converter 54 of any suitable type known to the art. With the 9 volt potential thus applied to the converter 54, it produces a minus 9 volts potential at the common terminal of a resistance 58 and a capacitor 60. It will be appreciated that the circuitry just described associated with SS1 constitutes the power supply of the tester 10 with terminal 52 carrying +9 volts and terminal 56 carrying −9 volts.

Receptacle 14 has terminals 62 and 64 which provide the microphone input to the tester 10. We connect a load resistor 66 between a terminal 68 connected to the +9 volts supply and terminal 62 to match the microphone. In one embodiment, the microphone 20 may be a carbon replacement type microphone with the load resistor 66 being a standard carbon replacement load.

A series connected capacitor 70 and resistor 72 couple the microphone input to an inverter indicated generally by the reference character 74. We apply the output of inverter 74 to a buffer 76, the output of which is coupled by a series connected capacitor 78 and resistor 80 to a rectifier or peak detector 82.

A resistor 84 carries the output of the peak detector 82 to a display driver 90 of any suitable type known to the art. A filter made up of parallel connected capacitor 86 and resistor 88 smooths the output of the peak detector as it is applied to the driver 90. Driver 90 provides the signal for the display 44. As is known in the art, the number of LEDs of the display 44 which are lighted is an indication of the strength of the signal from the microphone 62. That is to say, as the voice input varies more or less of the LEDs will be illuminated.

Our tester 10 includes a Wein bridge oscillator 92 including a light bulb 94.

A resistor 96 couples the output of the oscillator 92 to a buffer 98, the input of which is connected to ground through a calibrating resistor 100. A capacitor 102 couples the output of the buffer 98 to the "b" terminal associated with switch arm SS3.

PB2 which is closed upon actuation of button 38 applies the signal at terminal "b" associated with SS3 to a voltage divider made up of resistors 104 and 106, the common terminal of which is connected to resistor 72.

Parallel connected resistor 108 and capacitor 110 couple the signal at SS3 to an amplifier indicated generally by the reference character 112, the output of which is connected to terminal "c" associated with switch SS2. As will be explained more fully hereinbelow, we adjust calibrating resistor 100 such that when SS3 engages its associated contact "b", the potential at capacitor 114 will be approximately 1.0 volts rms, Our tester includes a potentiometer 116 connected in series with a resistor 118 and switch PB1 between capacitor 114 and ground.

Series connected capacitor 120 and resistor 122 connect the common terminal of potentiometer 116 and resistor 118 to a peak detector or rectifier indicated generally by the reference character 124.

We connect a common terminal of a resistor 126 and a capacitor 128 connected between the output of detector 124 and ground to the input of a window comparator indicated generally by the reference character 130.

We connect a resistor 134, LED 40 and a transistor 132 in series between the +9 volts supply and ground. As will be described more fully hereinbelow, under certain conditions the output of the comparator 130 renders transistor 132 conductive to cause LED 40 to light.

From the structure described, it will readily be apparent that as long as arm 36 is not in the "off" position, the device is powered up. With the microphone plugged in to the tester, the voice of anyone speaking into the microphone will register on the indicator 44.

For the self-test, switch arms SS1, SS2 and SS3 are moved into engagement with their associated "b" contacts. At the same time potentiometer 116 is set to a value equal to the value of resistor 118. Next, button 38 is operated to close PB1 and PB2. Closing of PB2 applies the output of the oscillator buffer 98 to the channel including inverter 74, buffer 76, detector 82 and driver 90, so that the bar indicator 44 shows the level of the signal.

Closing of the switch PB1 causes half the output at capacitor 114 to appear across resistor 118. Since that output had been set at 1 volt rms and potentiometer 116 is set to a value equal to that of resistor 118, the result should be the application of 0.5 volts rms to the peak detector 124.

We so set up the window comparator 130 as to produce an output for rendering transistor 132 conductive when the input to the comparator 130 is half the voltage at capacitor 114 plus or minus 10% for example. If the potential at the input to the comparator 130 is within these limits when PB1 is closed during a self-test, LED 40 will light to indicate that the tester 10 is functioning properly.

For the TALK THRU test, switch arms SS1, SS2 and SS3 are moved into engagement with their "c" contacts. Under these conditions it will be seen, first, that the oscillator 92 is out of the circuit. Secondly, the output of inverter 74 is applied not only to the buffer 76 but also to the amplifier 112 through SS3. The output of the amplifier in turn is applied through SS2 to the earphones connected to terminals 136 and 138. With these connections, a person speaking into the microphone 20 can hear himself through the earphones 32 and 34.

In order to perform a test of the earphone impedance, switch arms SS1, SS2 and SS3 are moved into engagement with their associated "d" contacts. When that has been done and with the earphones plugged into terminals 136 and 138, the earphones will be connected in series with the potentiometer 116 between capacitor 114 and ground. If the potentiometer has been set to the known impedance of the earphones and if that impedance is of the proper value, LED 40 will light. If the impedance of the earphones is not known, potentiometer 116 is adjusted until the LED 40 lights and the impedance of the earphones can be read from the dial associated with arm 42.

It will be seen that we have accomplished the objects of our invention. We have provided an aircraft communication headset tester. Our tester can be hand held. It is expeditious to use. Our tester is adapted to check the known impedance of the earphones of the headset. Our tester is able to measure the unknown impedance of the headset earphones. It is provided with a TALK THRU test. We provide our unit with a SELF test feature.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. A device for testing an aircraft communication headset having earphones provided with an earphone plug and a microphone provided with a microphone plug, said device comprising
   a housing,
   an earphone receptacle on said housing for receiving said earphone plug,
   a microphone receptacle on said housing for receiving said microphone plug, a multi-position function selector switch within said housing movable from an off position to a self-test position and to a talk-through position and to an earphone impedance test position, means on said housing for moving said selector switch to said positions, normally open self-test switch means within said housing, means on said housing for closing said self-test switch means, a volume display on said housing, first circuit means within said housing for coupling said microphone receptacle to said volume display, energizable indicator means on said housing, an oscillator within said housing, means operative in the self-test and earphone impedance test positions of said selector switch for deriving a voltage of a predetermined magnitude from said oscillator, a variable impedance in said housing, means for coupling said predetermined magnitude voltage to said variable impedance, a second impedance in said housing, said variable impedance having a common terminal with both said earphone receptacle and said second impedance, first means responsive to closing of said self-test switch means with said selector switch in its self-test position for applying said oscillator output to said first circuit means, second means responsive to closing of said self-test switch means with said selector switch in its self-test position for connecting said variable impedance and said second impedance in a first voltage divider circuit to provide a self-test voltage at said common terminal, means responsive to said selector switch in its earphone impedance-test position for connecting earphones plugged into said earphone receptacle in a second voltage divider circuit with said variable impedance to provide an impedance-test voltage at said common terminal, and means responsive to said self-test voltage and to said impedance-test voltage for energizing said indicator means when said device is functioning correctly and when said earphone impedance is correct.

said first impedance having a terminal common to said second impedance and to said earphone receptacle, indicator means connected to said common terminal, means responsive to the selector switch in its self-test position for producing a first voltage at said common terminal, means responsive to said first voltage for causing said indicator means to indicate whether said device is functioning properly, means responsive to the selector switch in earphone impedance testing position for producing a second voltage at said common terminal and means responsive to said second voltage for causing said indicator means to indicate whether the impedance of earphones plugged into said receptacle falls within a predetermined range of values.

2. A device as in claim 1 in which said variable impedance is a potentiometer having a wiper arm and means on said housing for moving said wiper arm.

3. A device as in claim 1 in which said means responsive to said self-test and impedance-test voltages comprises a peak detector.

4. A device as in claim 3 in which said means responsive to said voltages includes a window comparator responsive to the output of said peak detector.

5. A device as in claim 1 in which said means for deriving said signal from said oscillator comprises calibrating means.

6. A device for testing an aircraft communication headset having earphones provided with an earphone plug including in combination, a casing, an earphone receptacle on said casing for receiving said earphone plug, a multi-position function selector switch within said casing movable to a self-test position and to an earphone impedance testing position, normally open self-test switch means within said casing, means on said casing for closing said self-test switch means, an oscillator within said casing, a first impedance within said casing, a second impedance within said casing, means responsive to closing of said self-test switch means and to said selector switch in its self-test position for connecting said first and second impedances in series between said oscillator and ground, means responsive to said selector switch in said earphone testing position for connecting said first impedance and said earphone receptacle in series between said oscillator and ground, said first impedance having a terminal common to said second impedance and to said earphone receptacle, indicator means connected to said common terminal, means responsive to the selector switch in its self-test position for producing a first voltage at said common terminal, means responsive to said first voltage for causing said indicator means to indicate whether said device is functioning properly, means responsive to the selector switch in earphone impedance testing position for producing a second voltage at said common terminal and means responsive to said second voltage for causing said indicator means to indicate whether the impedance of earphones plugged into said receptacle falls within a predetermined range of values.

7. A device as in claim 6 in which said indicator means comprises an illuminable element on said casing.

8. A device as in claim 6 including a microphone receptacle on said casing, said selector switch having a talk-through position and means operative in the talk-through position of said selector switch for connecting said microphone receptacle to said earphone receptacle.

9. A device as in claim 6 including a volume display on said casing and means for coupling said microphone receptacle to said volume display.

10. A device as in claim 6 in which said first impedance is a potentiometer.

* * * * *

UNITED STATES PATENT AND TRADEMARK OFFICE
CERTIFICATE OF CORRECTION

PATENT NO. : 5,400,406
DATED : March 21, 1995
INVENTOR(S) : Ture A. Heline, Jr. and Robert Ingalls It is certified that error appears in the above-indentified patent and that said Letters Patent is hereby corrected as shown below:

In Claim 1, col. 5, line 49, after "correct."  delete all the rest of Claim 1.

Signed and Sealed this

Twenty-third Day of May, 1995

*Attest:*

*Attesting Officer*

BRUCE LEHMAN

*Commissioner of Patents and Trademarks*